United States Patent [19]

Nishi et al.

[11] Patent Number: 4,780,616

[45] Date of Patent: Oct. 25, 1988

[54] PROJECTION OPTICAL APPARATUS FOR MASK TO SUBSTRATE ALIGNMENT

[75] Inventors: Kenji Nishi, Kawasaki; Hidemi Kawai, Yokohama; Kazuaki Suzuki; Makoto Uehara, both of Tokyo, all of Japan

[73] Assignee: Nippon Kogaku K. K., Tokyo, Japan

[21] Appl. No.: 99,913

[22] Filed: Sep. 22, 1987

[30] Foreign Application Priority Data

| Sep. 25, 1986 | [JP] | Japan | 61-224918 |
| Sep. 25, 1986 | [JP] | Japan | 61-224919 |
| Nov. 28, 1986 | [JP] | Japan | 61-282029 |

[51] Int. Cl.$^4$ .............................................. G01N 21/86
[52] U.S. Cl. ..................................... 250/548; 356/400
[58] Field of Search ............... 250/548, 557, 560, 561; 356/400, 401, 375; 355/53, 54

[56] References Cited

U.S. PATENT DOCUMENTS

| 4,496,241 | 1/1985 | Mayer | 250/548 |
| 4,629,313 | 12/1986 | Tanimoto | 355/53 |
| 4,639,604 | 1/1987 | Murakami et al. | 250/548 |
| 4,642,468 | 2/1987 | Tabata et al. | 250/557 |
| 4,650,983 | 3/1987 | Suwa | 250/204 |

*Primary Examiner*—David C. Nelms
*Attorney, Agent, or Firm*—Shapiro and Shapiro

[57] ABSTRACT

The projection optical apparatus includes light-emitting means which are disposed on a stage movable along the image plane in the projection optical apparatus and which define a light-emitting plane having a predetermined shape; photoelectric detection means which is disposed at a position substantially in conjugate relationship with a pupil of said projection optical apparatus and which receives the light emitted from the light-emitting plane of the light-emitting means through the projection optical system and a mask in which a pattern is defined at a predetermined position; and position detection means which controls the stage in such a way that the image projected on the light-emitting plane is shifted in relation to the mask pattern and which detects the superposed position between the image and the pattern in response to the light signal derived from the photoelectric detection means while the projected image is shifted and to the position of the stage.

15 Claims, 7 Drawing Sheets

PROJECTION OPTICAL APPARATUS FOR MASK TO SUBSTRATE ALIGNMENT

BACKGROUND OF THE INVENTION

1. Field of the Invention

The present invention relates to a projection optical apparatus and more particularly a system for measurement in order to attain the precise alignment between a mask and a substrate.

1. Related Background Art

In the projection optical apparatus of the type in which a pattern on a mask or a reticle is focused on a substrate such as a semiconductor wafer, in order to attain positional alignment between the mask or the reticle and the substrate, the alignment step using alignment marks has been used. That is, when the pattern on the reticle is focused on the substrate while the alignment mark on the reticle is maintained in alignment with the alignment mark on the substrate at a higher degree of accuracy through a projection optical system, the projected pattern image can be formed on the substrate without causing any positional deviation.

However, in general, the projection optical system have distortion so that even when the precise position alignment by using the alignment marks, the relative positional deviation between the projected image and the substrate results due to distortions in the projection optical system.

A degree of such positional misalignment due to distortions described above depends upon the height of the image. Therefore it has been desired that in order to attain the precise alignment between the projected image and the substrate, the distortion characteristics of the projection optical system must be measured so that the attained positional alignment must be corrected by using the alignment marks.

Especially in the case of the stepper, that is, an exposure apparatus of the type in which the pattern on the reticle is focused repeatedly at a reduced scale over a plurality of regions of a substrate so that a plurality of chips are defined on the substrate, if the direction and the quantity of distortion corresponding to the position of a chip can be evaluated at a high dggree of accuracy, a suitable correction of the positional alignment between each chip and the projected image can be accomplished.

Meanwhile, in the case of the exposure apparatus in which the exposure light used to focus an image and the alignment light are different in wavelength from each other, chromatic aberrations of both the exposure light and the alignment light are corrected in the projection optical system. In this case, for example, a correction optical system for varying the optical length of the alignment light is incorporated.

The distortion quantity in the projection optical system can be divided into a distortion in the S (sagittal) direction and a distortion in the M (meridional) direction in order to evaluate the distortion quantity.

In the case of the projection optical system in which chromatic aberrations for two light waves are corrected as described above, it is in general difficult to make the distortion quantities of the two light waves same in the all directions. As a result, there arises the problem that even when the precise alignment can be precisely attained, there is a possibility that the position of the projected image is different from an optimum exposure position in practice.

Furthermore, even in the case of the correction in response to the simultaneous measurements of the magnifications (the size of the projected image of the reticle pattern) in the projection optical system, there arises the problem that a magnification offset (errors in measurement) results.

SUMMARY OF THE INVENTION

In view of the above, the primary object of the present invention is to provide a projection optical apparatus capable of measuring distortions or magnifications with a higher degree of accuracy within a short time period.

The projection optical apparatus in accordance with the present invention includes light-emitting means which are disposed on a stage movable along the image plane in the projection optical system and which define a light-emitting plane having a predetermined shape; photoelectric detection means which is disposed at a position substantially in conjugate relationship with a pupil of said projection optical system and which receives the light emitted from said light-emitting plane of said light-emitting means through the projection optical system and a mask in which a pattern is defined at a predetermined position; and position detection means which controls said stage in such a way that the image projected on said light-emitting plane is shifted in relation to the mask pattern and which detects the superposed position between said image and said pattern in response to the light signal derived from said photoelectric detection means while said projected image is shifted and to the position of said stage.

According to one preferred embodiment of the present invention, the superposed position detected by said position detection means is compared with the design data so that a degree of distortion at this position is determined.

Another object of the present invenion is to measure with a high degree of accuracy a deviation between distortions of the alignemnt and exposure light, thereby preventing the optical offset between the alignment and exposure positions.

To the above and other ends, the system in accordance with the present invention includes aberration detection means and correction means. Said aberration detection means detects aberrations of the exposure and alignment lights, respectively, at suitable positions within the projection field of the projection optical system and then said correction means corrects the aberration differences detected by said aberration detection means in the case of the relative positional alignment between a substrate and the mask pattern by alignment means.

DESCRIPTION OF THE PREFERRED EMBODIMENTS

Figure 1:
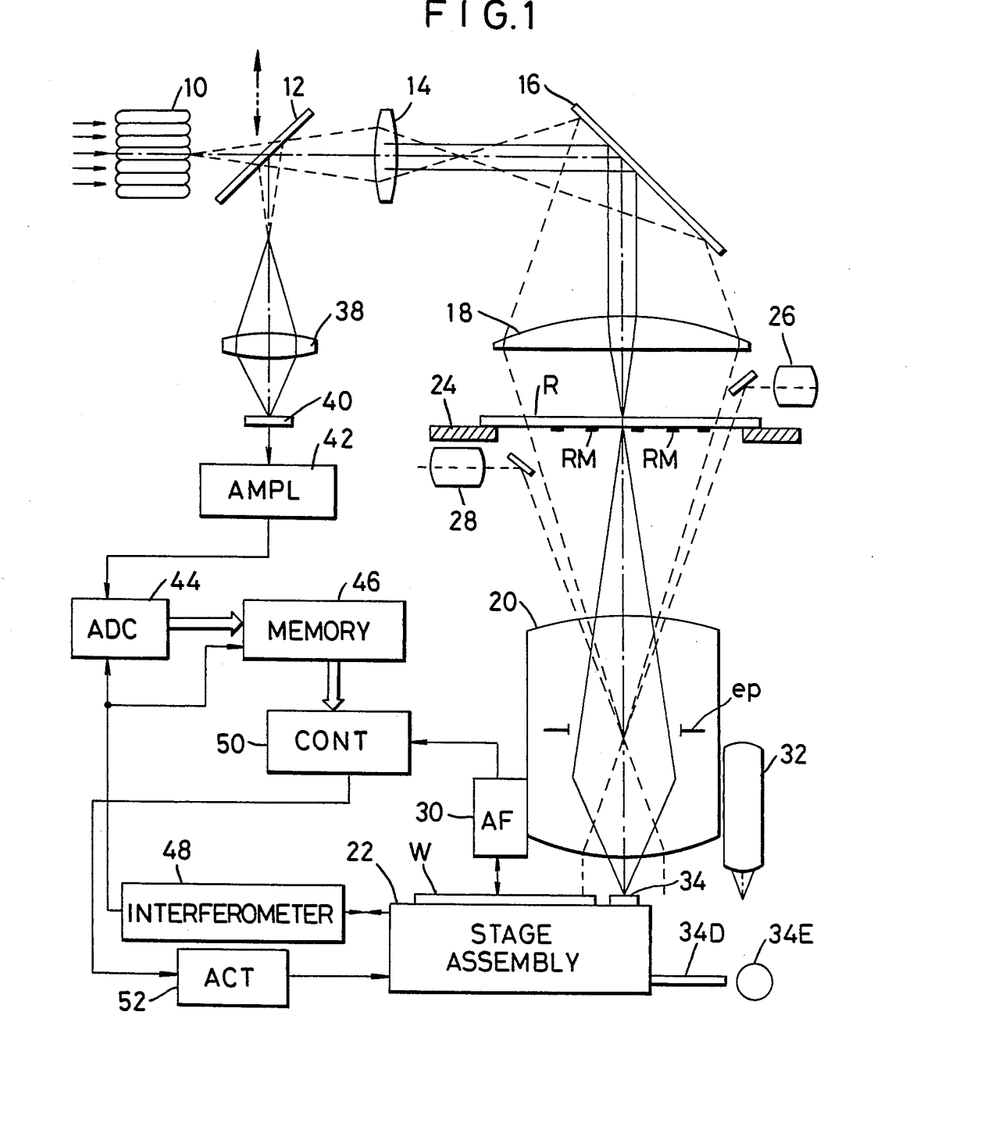
FIG. 1 is a schematic view illustrating the construction of a first preferred embodiment of the present invention.

FIG. 1 shows a first preferred embodiment of the present invention. The illuminating light (for instance, the g line, i line or the like) emitted from a light source (not shown) falls on a dichroic mirror 16 through a fly-eye lens 10, a beam splitter 12 having a low degree of reflectivity and a relay optical system 14.

The illumination light reflected by the dichroic mirror 16 passes through a condenser lens 18 and falls on a reticle R. Thereafter it passes through a projection lens 20 having a telecentric characteristic at an image side thereof and falls on a semiconductor wafer W placed on a stage assembly 22.

Disposed adjacent to the reticle R are a TTL alignment microscope 26 for establishing alignment between the reticle R and the wafer W and a TTL alignment microscope 28 exclusively used for alignment of the wafer W.

Figure 2:
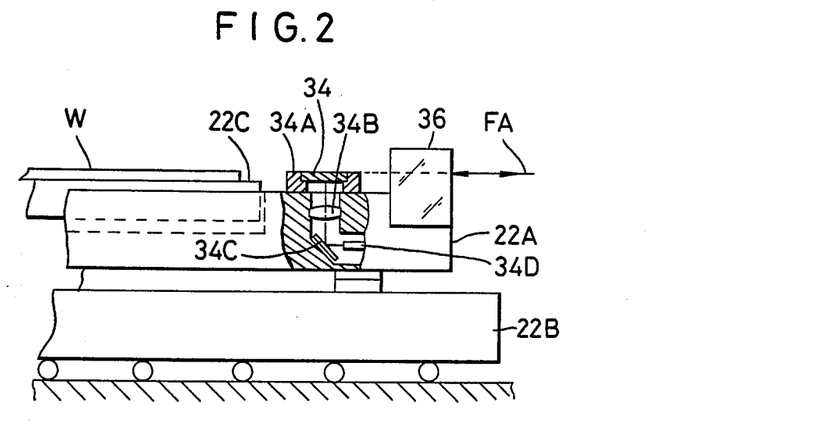
FIG. 2 is a side view, partly in section, illustrating the detailed construction of a stage assembly shown in FIG. 1.

A slit plate 34 mounted on the stage assembly 22 has an upper surface substantially in coplanar relationship with that of the wafer W as shown, on enlarged scale, in FIG. 2. The stage assembly 22 has a Z stage 22A movable in the Z direction along the optic axis of the projection lens 20, an XY stage 22B movable over an XY plane perpendicular to the Z-direction and a θ table 22c rotatable through an extremely small angle about an axis extended in the Z-direction. The wafer W is placed over the θ stage 22C while the slit plate 34 is securely mounted on the Z stage 22A by means of a retaining member 34A.

A lens 34B, a mirror 34C and an optical fiber 34D are disposed within the Z stage 22A. The interior surface of the slit plate 34 is illuminated through these optical elements 34D, 34C and 34B by the light which is emitted from a light source 34E (FIG. 1) and whose wavelength is equal to that the exposure light. The slit plate 34 is disclosed in detail in, for instance, U.S. Pat. No. 4,629,313.

Figure 3:
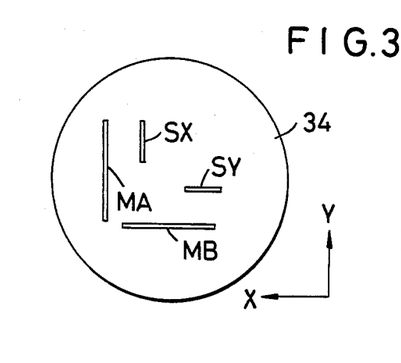
FIG. 3 is a top view of a slit plate.

A reflecting surface 36 is defined at one side of the Z-stage 22A to reflect the laser beam emitted from laser interferometer 48A. The laser beam travels along the optic axis substantially in coplanar relationship with the surface of the slit plate 34 and falls perpendicularly on the reflecting surface 36 as indicated by an arrow FA. For instance, the slit plate 34 consists of an optically transparent glass plate with a slit-shaped window surrounded by a light shielding film such as chromium coated over the surface of the glass plate. In the case of the slit plate 34 as shown in FIG. 3, it has a slit SX extended in the X-direction, a slit SY extended in the Y-direction and reference marks MA and MB for respective alignment systems. Of these slits, the light-emitting slit SX is defined in the form of a rectangle of $4 \times 100$ micrometers, for instance.

Figure 4:
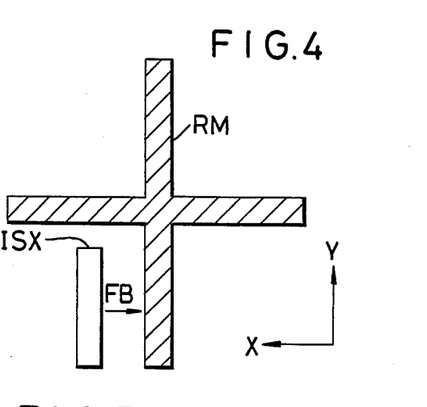
FIG. 4 is a view used to explain a reticle mark and the image of a light-emitting slit.

The reticle R is formed with a plurality of recticle marks RM each positioned at predetermined cordinates within the effective field of the projection lens. Each reticle mark RM has a shape as shown in FIG. 4 and is formed by a light shielding material such as chromium.

The light ray passing through each slit of the slit plate 34 passes through the projection lens 20, the reticle R and the condenser lens 18 and falls on the dichroic mirror 16. The light reflected back from the dichroic mirror 16 passes through the relay optical system 14, reflected by the beam splitter 12 and falls on a photoelectric transducer or detector 40 through a condensor lens 38. The detector 40 is disposed substantially in optically conjugate relationship with the pupil ep of the projection lens 20. In this connection, it is to be understood that the condenser lens 38 may be eliminated and that the detector 40 can be directly disposed at a position in optical conjugate relationship with the pupil ep in the path of the light reflected from the beam splitter 12.

The photoelectric output derived from the detector 40 is amplified by an amplifier 42 and is applied to an analog-to-digital conveter (to be referred to as "ADC" hereinafter in this specification) 44 so that it is converted into the digital signal and then stored in a memory 46 as data.

The position signal representative of the coordinates of the stage assembly 22 and derived from the interferometer 48 are applied to ADC 44 and the memory 46 and the AD conversion is carried out in response to the position signal and the output data derived from ADC 44 is simultaneously stored in an address in the memory 46 represented by the position signal.

The date stored in the memory 46 is delivered to a main control unit 50 which in turn delivers the driving signal to an actuator 52 for driving the stage assembly 22 in response the received data and the output derived from a focus sensor 30.

The light emitted from the slit plate 34 is distributed almost over the whole area of the pupil ep of the projection lens 20 and the light-receiving surface of the detector 40 is so designed and defined as to cover the entire pupil ep.

Next the mode of operation of the first embodiment with the above-described construction will be described in detail. The light-emitting slit SX of the slit plate 34 is in the form of a rectangle as described above so that the illumination light having a rectangular cross section reaches the projection lens 20 while the exposure illumination light is of course turned off.

The image of the light-emitting slot SX focused on the reticle R is displaced in unison with the displacement of the stage assembly 22. In the case of FIG. 4, the image ISX of the light-emitting slit SX is displaced in the direction FB with respect to one of the reticle marks RM.

Figure 5:
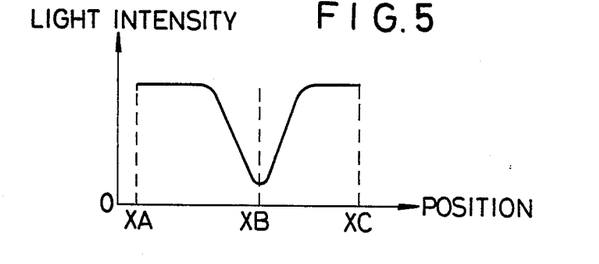
FIG. 5 is a graph used to explain the waveform of a light signal derived from a detector.

As a result, the image ISX superposes on one of the reticle marks RM and a degree of superposition is detected in terms of the decrease in light intensity by the detector 40 as shown in FIG. 5. In this case, the light quantity drops to a minimum level at the position XB as compared with the positions XA and XD so that it can be confirmed that the image ISX precisely superimposes on the reticle mark RM.

Meanwhile the coordinate position of the stage assembly 22 is detected by the interferometer 48 so that the position signal is applied to ADC 44 and then to the memory 46. In synchronism with the position signal, the photoelectric output derived from the detector 40 is sampled and then converted into the digital signal and stored at the address in the memory 46 corresponding to the position signal.

When the projection lens 20 has no distortion at all, the position at which the image of the light-emitting slit and the reticle are superposed one upon another can be obtained from the design data and the bottom position (the mark detection point) detected by the detector 40 and stored in the memory 46 coincides with the design data.

However, the projection lens 20 does include distortions in practice so that the design data does not coincide with the mark detection point. In this case, a degree of noncoincidence represents a degree of distortion at a position corresponding to the reticle mark.

Therefore when the mark detection points which are distributed over the whole effective field of the projection lens 20 are detected by the detector 40, distortions of the projection lens 20 can be measured. Same is true for the magnification of the projection lens 20.

The shift of the stage assembly 22 for the sake of sampling and storing data in the manner described above is made under the control of the main control unit 50.

As described above, according to the first embodiment of the present invention, a degree of distortions and magnification can be measured with a high degree of accuracy within a short period of time. Furthermore, the measured data are stored in the projection optical apparatus so that when the position of an alignment mark on the wafter W is different from the position of an alignment mark to be aligned with the first mentioned alignment mark, the correction of an alignment error due to the distortions can be easily made.

In the first preferred embodiment, instead of the beam splitter 12, a reflecting mirror having a reflecting surface in opposed relationship with the relay optical system 14 may be used so that in the case of the measurement of distortions, the loss of the quantity of light emitted from the slit plate 34 due to the detector 40 can be reduced, whereby the degree of measurement accuracy can be improved. In this case, when the wafer is exposed with the light emitted from the exposure light source, the reflecting mirror must be so disposed that it can be retracted from the optical path of the exposure light and inserted again into the optical path as indicated by the double-pointed arrow. As a consequence, the loss of the light quantity can be reduced in the case of the exposure step. In addition, in the first preferred embodiment, instead of the light source 34E and the optical fiber 34D, a semiconductor laser may be used. In this arrangement, the wavelength of the laser beam is different from that of the exposure light almost in all the cases so that the image surface is deviated from the image surface position of the exposure light due to the chromatic aberration of the projection lens 20.

However, both of the exposure light and the laser beam are rendered colorless, such deviation as described above does not result. When the deviation results due to chromatic aberration, the high of the slit plate 34 must be shifted accordingly, a small correction lens must be mounted on the slit plate 34 or in the case of the measurement with the light-emitting slit, the height of the Z-stage 22A must be shifted upwardly or downwardly depending upon a degree of chromatic aberration.

It is no necessary that the position of the slit plate 34 and the surface of the wafer W are in coplanar relationship with each other and it suffices that the surface of the wafer W is in coplanar relationship with the surface at which the images are focused through the projection lens 20 in the case of the measurement.

Figure 6:
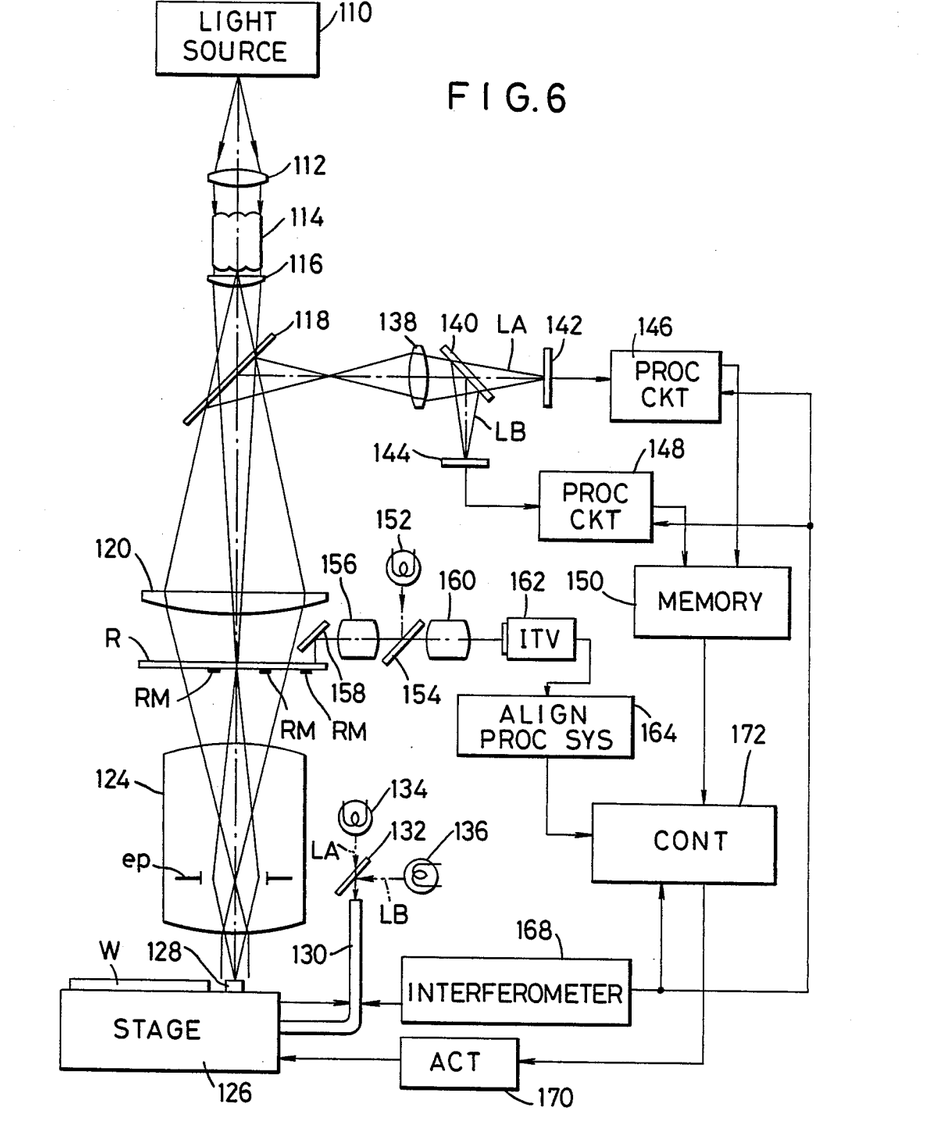
FIG. 6 is a schematic view illustrating the construction of a second preferred embodiment of the present invention.

FIG. 6 shows a second preferred embodiment of the present invention. The exposure light emitted from a light source 110 falls on a reticle R through an exposure optical system including a collimator 112, a fry-eye lens 116, a dichromic mirror 118 and a condensor lens 120. Thereafter the exposure light is transmitted through a projection lens 124 and falls on the wafer W placed on a stage 126. The pattern of the reticle is focused on the wafer W.

A slit plate 128 having a light-transmitting slit is mounted on the stage 126. As in the case of FIG. 3, the illumination light from light sources 134 and 136 falls on the lower surface of the slit plate 128 through a half mirror 132 (or dichroic mirror).

The illumination light LA having the same wavelength and N.A. (Numerical Aperture) with those of the exposure light is emitted from the light source 134 while the illumination light LB having the same wavelength and N.A. with those of the alignment light is emitted from the light source 136. The light may be simultaneously or selectively emitted from the light sources 134 and 136.

The projection lens 124 is designed as a lens system having an aberration characteristic (achromatic characteistic with two corrected two color bands). The wavelength $\lambda_1$ represents the exposure light in the ultraviolet spectrum while the wavelength $\lambda_2$ represents the alignment light having a long wavelength. It follows therefore that the slit plate 128 at the same height as the wafer surface and the reticle R are in conjugated relationship with each other about the projection lens 124 for the exposure light LA and the alignment light LB which have the different wavelength.

Figure 8:
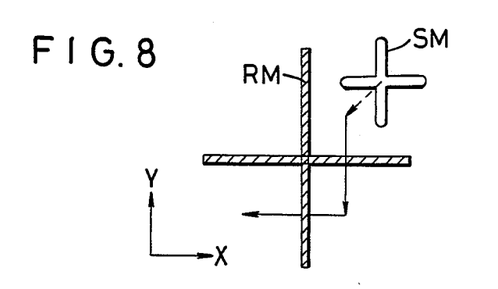
FIG. 8 is a view used to explain a scanning step for scanning a reticle mark with the detected light.

A plurality of cross-shaped reticle marks RM as shown in FIG. 8 formed by a material such as chrominium are marked on the surface of the reticle R in a suitable array. The slit plate 128 is formed with a cross-shaped slit corresponding to such cross-shaped reticle marks RM. The detection light beam having a cross-shaped cross sectional configuration emitted through the slit is focused through the projection lens 124 on the reticle R and thereafter is transmitted through the condensor lens 120, reflected by the dichroic mirror 118 and falls on a dichroic mirror 140 through a relay lens 138.

The dichroic mirror 140 has a reflectivity of a few percent for the light whose wavelength is equal to that of the exposure light and is adapted to totally reflect the light whose wavelength is equal to that of the alignment light. It follows therefore that the illumination light LA having the wavelength equal to that of the exposure light falls on a photosensor 142 while the illumination light LB whose wavelength is equal to that of the alignment light falls on a photosensor 144. These photosensors 142 and 144 are in conjugated relationship with the pupil ep of the projection lens 124 and each has a light receiving surface substantially equal in size to the image of the pupil of the projection lens 124.

The outputs of the photosensors 142 and 144 are connected to waveform processing circuits 146 and 148, respectively, which sample the light signals in synchronism with the pulse signal used in the case of the position measurement. The outputs of the processing circuits 146 and 148 are connected in common to a memory 150 in which is stored a distortion map prepared in response to the input data.

The alignment light which establishes the alignment between the reticle R and the wafer W is emitted from a light source 152 and falls on the reticle R through a beam splitter 154, an objective lens 156 and a mirror 158. Thereafter it is transmitted through the projection lens and falls on the wafer. The alignment light reflected back from the wafer W is transmitted again through the projection lens 124 and falls on a photosensor 162 such as an industrial television camera through the mirror 158, the objective lens 156, the beam splitter 154 and a relay lens 160. The output of the photosensor 162 is connected to an alignment processing system 164 which processes the signal.

The interferometer 168 and an actuator 170 as well as the above-described memory 150 and alignment processing system 164 are connected to a control unit 172. The control unit 172 has a double function of preparing a distortion map within the memory 150 and controlling the correction of the drive of the stage 126 in response to the distortion map thus prepared in the case of the alignment and exposure steps.

Figure 9:
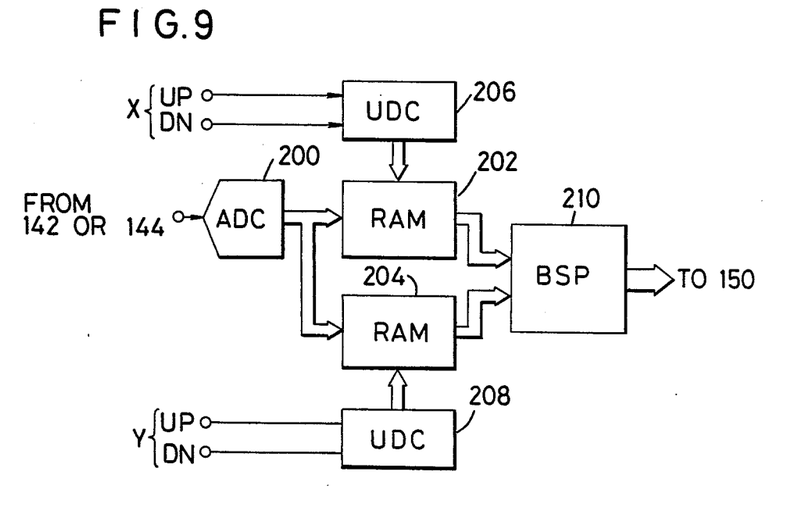
FIG. 9 is a block diagram of a waveshape processing circuit.

The waveform processing circuits 146 and 147 have a circuit arrangement disclosed, for instance, U.S. Pat. No. 4,639,604. FIG. 9 shows a block diagram of the waveform processing circuits 146 and 147 used in the second preferred embodiment. The photoelectric signal derived from the photosensor 142 (or 144) and amplified is applied to a high-speed analog-to-digital converter (ADC) 200 so that the analog signal is converted into the digital signal corresponding to the input level of the analog signal. The digital signals are applied in parallel to random access memories (RAM) 202 and 204. The address in the RAM 202 is designated by an up-down counter (UDC) 206 which the address in the RAM 204 is designated by UDC 208. The up pulse signal and the down pulse signal derived from the interferometer for measuring the position in the X-direction are applied to UDC 206 while the up pulse signal and the down pulse signal derived from the interferometer for measuring the position in the Y-direction perpendicular the X-direction are applied UDC 208. In response to the up pulse signals (representative of the shift of the stage 126 in the positive direction), UDC 206 and 208 increment the addresses while in response to the down pulse signal (representative of the shift of the stage 126 in the negative position), they decrement the addresses. Therefore, the photoelectric-signal waveform obtained when the stage 126 is shifted in the X-direction is stored in RAM 202 corresponding to the position (address) while the photoelectric-signal waveform obtained when the stage 126 is shifted in the Y-direction is stored in RAM 204 corresponding to the position (address). A high-speed arithetic unit 210 like a bit-slice processor (BSP) reads out each waveform from both RAMs 202 and 204 to detect the positional relationship (that is, the projected position of the mark RM in moving coordinate system of the stage 126 defined by the interferometer 168) between the slit pattern of the slit plate 128 and the mark RM of the reticle R. Furthermore, BSP 210 has also a function of a projected-position error due to distortions caused by the difference in wavelength of the illumination light for each mark RM on the reticle R.

Next the mode of operation of the second preferred embodiment with the above-mentioned construction will be described. First the actuator 170 shifts the slit plate 128 mounted on the stage 126 so that one of the reticle marks on the reticle R is illuminated by the detection light SM.

Thereafter the stage 126 is further shifted so that the detection light SM scans in both the X- and Y-directions to superpose the detection light SM on the reticle mark RM as indicated by the arrows in FIG. 8. Then the detection light SM is shielded by the reticle mark RM so that the outputs from the photosensors 142 and 144 vary. These outputs are amplified by the waveform processing circuits 146 and 148 as shown in FIG. 10.

Figure 10:
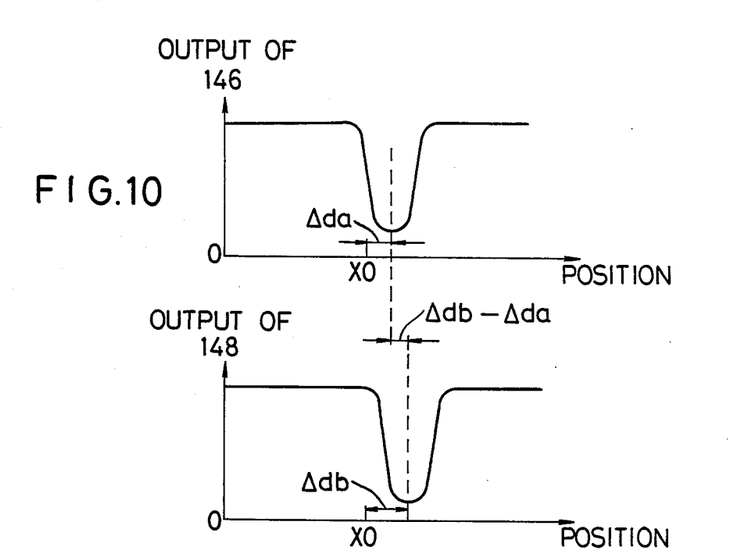
FIG. 10 shows the characteristics of the output derived from the waveshape processing circuit.

In FIG. 10, XO represents the position of the reticle mark being measured which is spaced apart from the center of the reticle and is a design value converted in terms of the upper surface of the wafer W. More particularly, if the projection lens has no distortion at all, the position XO represents the position at which the reticle mark and the detection light SM are superposed one on another from the standpoint of the design.

On the other hand, the output of the illumination light at an exposure wavelength derived from the circuit 146 falls to a minimum at a position spaced apart from the position XO by $\Delta$ da while the output of the illumination light at an alignment wavelength derived from the circuit 148 becomes a minimum at the position spaced apart from the position XO by $\Delta$ db. It is considerered that such positional deviations are caused by the distortions of the projection lens and that the greater the positional deviation, a higher the degree of distortions.

It is therefore considered that the positional deviation $\Delta$ da represents a degree of distortion with respect to the exposure wavelength at the position RM of the reticle mark while the positional deviation $\Delta$ db represents a degree of distortion with respect to the alignment wavelength at the position RM of the reticle mark.

Figure 11:
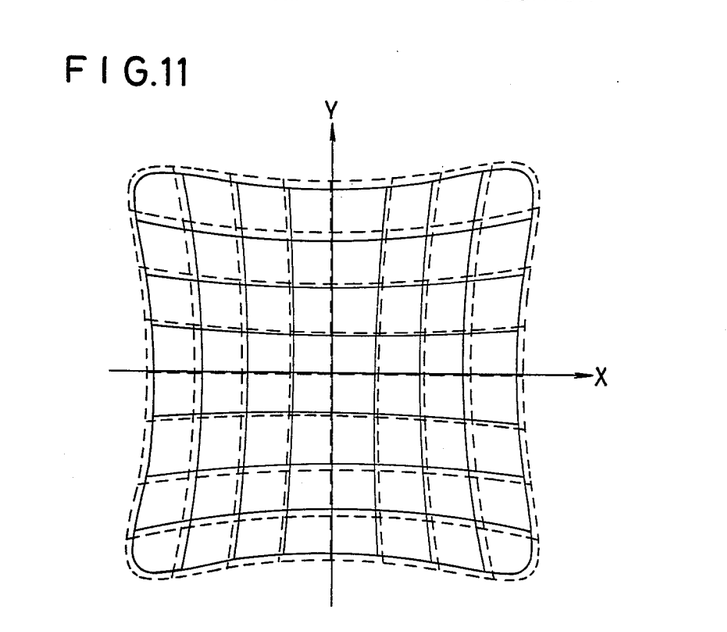
FIG. 11 is a schematic view illustrating a distortion characteristic.

When the degrees of distortion just described above are measured at a plurality of positions on the reticle, an aberration characteristic diagram as shown in FIG. 11; that is, a distortion mark can be obtained. In the diagram or map, the solid lines represent the characteristics of light rays at an exposure wavelength while the broken lines denote the characteristics of light rays at an alignment wavelength.

Figure 7:
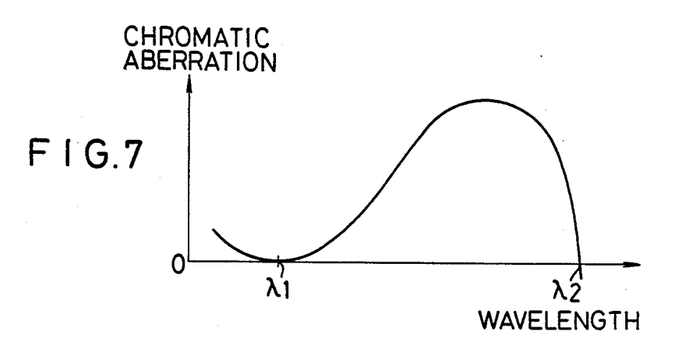
FIG. 7 is a graph illustrating a chromatic aberration characteristic.

At the origin (on the axes) of the X and Y coordinate axes, no chromatic aberration does not appear as shown in FIG. 7 for both of the exposure and alignment wavelengths, but chromatic aberrations appear at points off from the coordinate axes X and Y and vary depending upon the wavelengths and a hight of an image.

The positional deviation difference $\Delta$ db$-\Delta$ da shown in FIG. 10 corresponds a vector difference between an intersection between the solid lines and an intersection between the broken lines in FIG. 11.

More particularly, the deviations in the X- and Y-coordinate axes of one mark RM can be detected by BSP 210 so that a vector distortion can be immediately obtained from the positional deviations (Δ da and Δ da) in the X- and Y-directions. However, it is not necessary to obtain such vector deviation and it suffices to store the X and Y components separately. In the map shown in FIG. 11, the intersections of the solid-line matrix or the broken-line matrix represent degrees of deviations from the ideal matrix points under the assumption that each of marks RM on the reticle R is located at an ideal matrix point.

The distortions described above can be obtained by the waveform processing circuits 146 and 148 and are stored as a distortion map in a memory 150.

A control unit 172 corrects the position of the stage corresponding to the difference Δ db−Δ da by utilizing the distortion map stored in the memory 150. The correction step is made every time when the position of the reticle mark RM changes.

Figure 12:
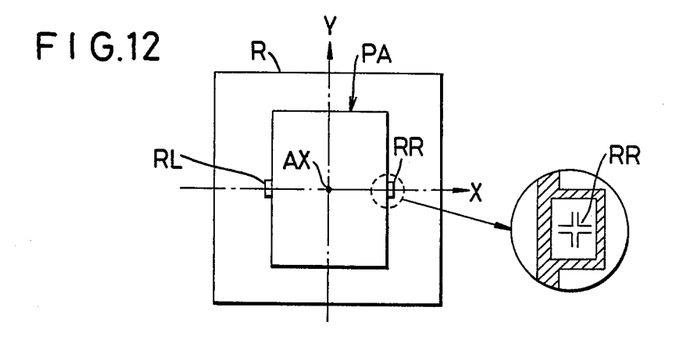
FIG. 12 is a top view illustrating the arrangement of a reticle pattern.

Next the correction step in the case of alignment will be described. The reticle R which is used in practice in the wafer exposure step is formed with a region PA in which a circuit pattern is defined and two alignment marks RL and RR at the opposite sides of the region PA as shown in FIG. 12. Each of the marks RL and RR is in the form of a double crossed pattern so that it can be aligned with the corresponding mark (for instance, a cross mark) on the wafer. In general, the center of the pattern on the reticle is so determined that the optic axis AX of the projection lens coincides with the center of the pattern. Since the position of the mark RR (or RL) with respect to the center of the reticle R is previously known, first the control unit 172 reads out the difference in degrees of distortions Δ da−Δ db in terms of both the X and Y components from the corresponding position from the distortion characteristic map. Thereafter, the mark RR (or RL) and the mark on the wafer are detected by the alignment optical system to attain the alignment between the reticle and the wafer. This alignment may be attained by the following steps. That is, after the mark RR (or RL) is aligned with the wafer mark, only the deviation between both marks is detected by the alignment processing system 164 and then the sum obtained by adding the difference (Δ da−Δ db) to the detected deviation is defined as an alignment error at an exposure wavelength.

When the alignment is established in the manner described above, the same effects attained when the alignment is attained by using the illumination light at an exposure wavelength can be attained.

In general, the measurement of a manification obtained by the projection lens 24 is made by utilizing a mark extended in the meridional direction, but scanning is made in the direction indicated by an arrow in FIG. 8, distortions both in the sagittal and meridional directions can be corrected.

Figure 13:
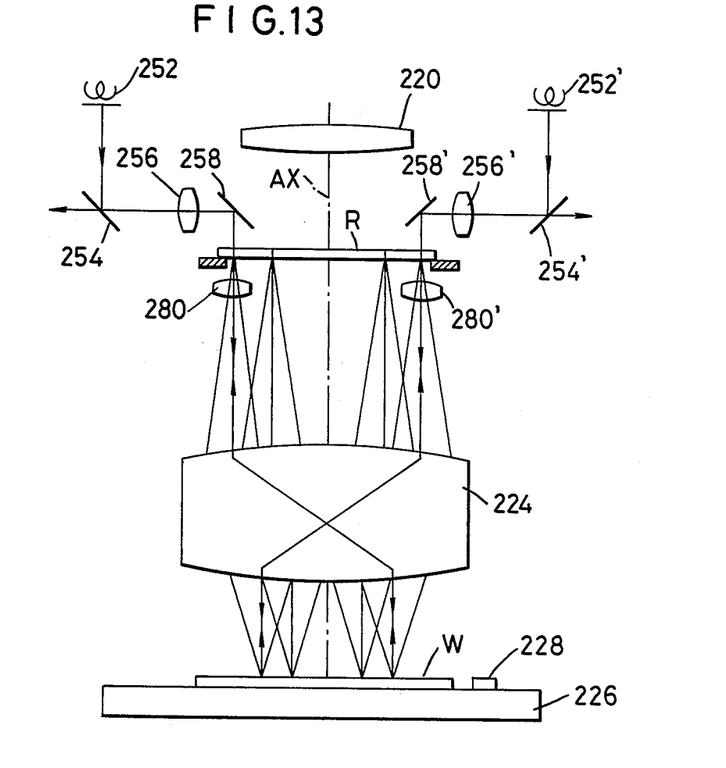
FIG. 13 is a schematic view illustrating the construction of an alignment system in a third preferred embodiment of the present invention.

FIG. 13 shows a third preferred embodiment of the present invention. The exposure light optical system including the condensor lens 20, the stage 226 with the slit plate 226 and the system which detects the light emitted from the slit plate thereby obtaining the output as shown in FIG. 10 are substantially similar to those, respectively, shown in FIG. 6 and a pair of alignment systems one of which includes the optical elements 252, 254, 256 and 258 and the other of which includes the optical elements 252', 254', 256' and 258' are substantially similar to the alignment system including the optical elements 152, 154, 156 and 158 shown in FIG. 6. The projection lens 224 is the telecentric system at both of the reticle side and the wafer side thereof. Therefore, when the reticle and the wafer are disposed in conjugate relationship with respect to the light at an exposure wagelength, the chromatic aberrations of the light at an alignment wavelength appear. The optical length corresponding to each chromatic aberration is corrected by a small lens 280 interposed between the reticle R and the projection lens 224 along the alignment optical path. The present invention may be equally applied to exposure systems or devices each having the above-mentioned optical alignment system. In the third embodiment, the pair of alignment systems one of which includes the objective lens 256, the mirror 258 and the small lens 280 and the other of which includes the objective lens 256', the mirror 258' and the small lens 280' are moved in unison.

Figures 14, 15, 16:
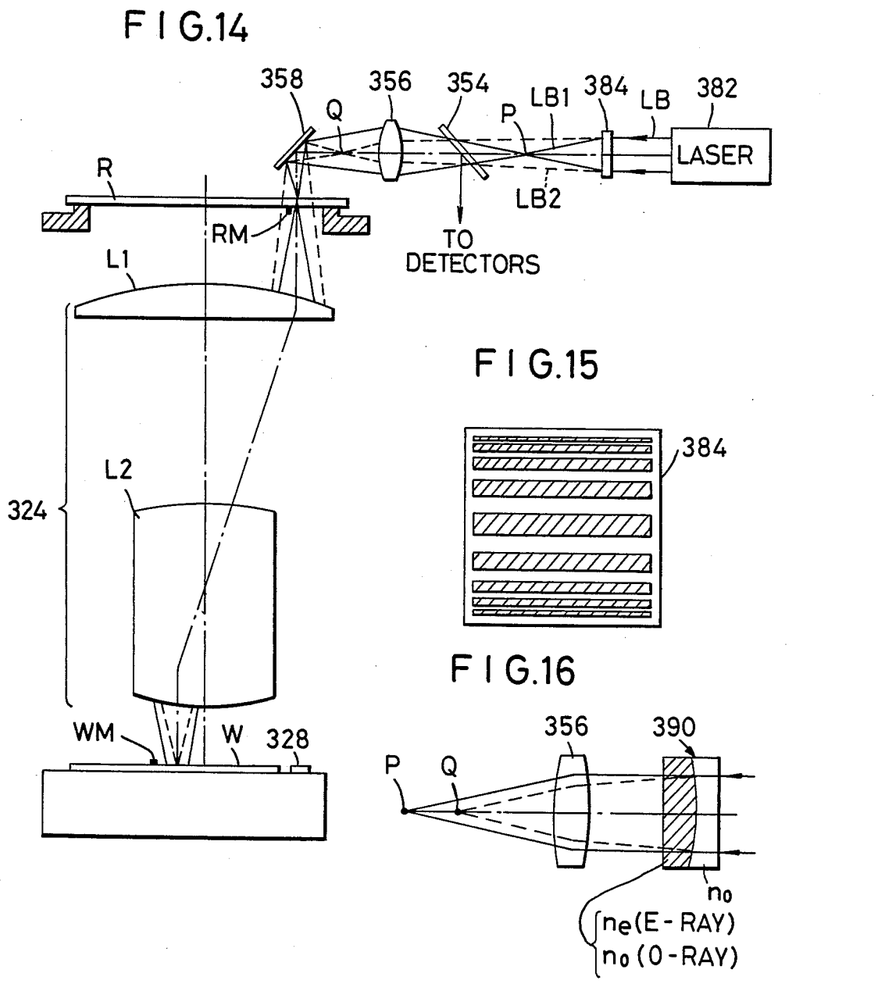
FIG. 14 is a schematic view illustrating the construction of an alignment system in a fourth preferred embodiment of the present invention.
FIG. 15 is a top view of a Fresnel plate.
FIG. 16 is a view illustrating the optical path of a lens having two focal points.

However, when the small lenses 280 and 280' are movable in response to the position of the marks, an alignment error which cannot be neglected or tolerated occurs due to an extremely angle of inclination and positional error of the small lens. However, another alignment system of the type as shown in FIG. 14 is used, the small lenses for correcting chromatic aberrations can be eliminated.

A projection lens 324 is the telecentric system at both sides of the reticle and the wafer because of lens systems L1 and L2. A collimated laser beam LB emitted from an alignment laser source 382 fall on a Fresnel plate 384 having a transparent linear Fresnel pattern as shown in FIG. 15. As is well known in the art, the Fresnel pattern has a function of forming focused image points at a plurality of focal lengths. Part of the laser beam LB1 transmitted through the Fresnel plate 384 is focused at a point P on a plane including the optical axis while the remaining laser beam LB2 passes through a beam splitter 354 and an objective lens 356 and is focused at a point Q on the above-mentioned plane. The point P is determined so that it is in conjugate relationship with the mark RM on the reticle R with respect to the objective lens 356 and a linear spot light appears on the reticle R by the laser beam B1. The optical length from the point Q to the reticle is so determined that it becomes equal to a degree of chromatic aberration caused by the projection lens 324 through which passes the laser beam LB at a predetermined wavelength. Therefore the laser beam LB2 passes through the reticle and is focused by the projection lens on the wafer W in the form of a linear spot light. When the laser beams LB1 and LB2 are polarized in the different directions, respectively, it becomes possible to distinctly separate the light information obtained through the beam splitter 354 from the reticle mark RM from the light information obtained from the wafer mark WM and to correctly detect them. In the case of the alignment step, the spot light on both of the surfaces of the recticle and wafer is caused to scan each mark by causing rotational oscillations of the Fresnel plate 384. Instead of the Fresnel plate 384, a bifocal lens 390 as shown in FIG. 16 may be inserted between the beam splitter 354 and the objective lens 356 so that the laser beam converges at two different focal points. The bifocal lens 390 comprises a concave lens having a refractive index $n_o$ and a convex lens which has a refractive index $n_e$ for an extraordinary (E) ray, but having a refractive index $n_o$ for an ordinary (O) ray. As described above, the light transmitting system of the alignment illumination light is so designed and constructed as to have two focal lengths so that the small correction lenses can be eliminated and a degree of accuracy of alignment can be satisfactorily maintained. The present invention may equally applied to the alignment system of the type just described above.

In the first, second and third embodiments, only a degree of distortion of the light-emitting slit of the slit plate may be measured at a point adjacent to an alignment mark (for instance, RL or RR shown in FIG. 12) on the reticle by the alignment system and any distortion measured may be during the alignment step.

According to the preferred embodiments described above, of the chromatic aberrations, the magnification chromatic aberration has been especially taken into consideration, but there arises a case in which a degree of chromatic aberration in the optical axis varies even though its variation is extremely small. In order to solve such problem, the TTL type focus check mechanism of the type disclosed, for instance, in U.S. Pat. No. 4,650,983 is provided so that the focus position which varies in response to the difference in height of the image is mapped. Furthermore, in the above-mentioned preferred embodiments, the present invention has been described when the difference in wavelength between the exposure light and the illumination light is relatively large and even when the alignment laser beam (He-Cd) which is slightly different in wavelength from the exposure light (g line), the present invention may be equally applied to suitably correct aberrations which cannot be neglected.

What is claimed is:

1. A projection optical apparatus comprising:
    a projection optical system interposed between a pattern provided at a predetermined position on a mask and a predetermined image plane; mark means emitting light on a plane substantially in coplanar relationship with said image plane, the light emitted from said mark means being focused through said projection optical system to form an image of said mark means on said mask;
    shift means for shifting said mark means along said image plane and generating the output corresponding to the shifted position of said mark means;
    photosensor means for receiving the light emitted from said mark means through said projection system and said mask and generating the output representative of the received light; and
    position detection means for determining a position of said pattern on said mask in response to the output from said photosensor means generated when said mark means is being shifted by said shift means and to the output from said shift means.

2. A projection optical apparatus as set forth in claim 1, wherein said photosensor means includes a light receiving surface disposed substantially in a conjugate relationship with a pupil of said projection optical system.

3. A projection optical apparatus as set forth in claim 1, wherein said shift means comprises stage means which supports said mark means and is movable along said image plane and means for measuring the position of said stage means.

4. A projection optical apparatus as set forth in claim 3, wherein said mark means comprises a light shielding member with a small opening formed at a predetermined position on said stage means and a light source disposed at the opposite side of said projection optical system with said light shielding means interposed therebetween.

5. A projection optical apparatus as set forth in claim 1, further comprising an illumination optical system for illuminating said mask comprising a light source and condenser lens means which formes the image of said light source on said pupil of said projection optical system and which is interposed between said light source and said mask so that the light having a substantially uniform intensity is distributed over said mask; and wherein said photosensor means includes light extracting means for extracting the light emitted from a light path between said light source and said condenser lens means.

6. A projection optical apparatus as set forth in claim 5, wherein said light extracting means includes beam splitter means interposed between said light source and said condenser lens means.

7. A projection optical apparatus as set forth in claim 5, wherein said light extracting means includes a movable reflecting mirror interposed between said light source and said condenser lens means.

8. A projection optical apparatus as set forth in claim 1, wherein said position detection means detects the variation in output from said photosensor means generated when said image of said mark means is superposed on said pattern on said mask and determines said position in response to the output from said shift means.

9. A projection optical apparatus as set forth in claim 8, wherein said position detection means detects the variation of the output from said photosensor means at a plurality of positions on said pattern on said mask to determine corresponding plural positions, respectively, and said device further comprising means for determining an optical characteristic of said projection optical system on the basis of said plural positions.

10. A projection optical apparatus comprising illumination means for emitting a light at a first wavelength;
    a projection optical system for projecting the image of a pattern on a mask illuminated by said illumination means onto an image plane;
    means for disposing a photosensitive substrate in coplanar relationship with said image plane;
    alignment means for using a light at a second wavelength different from said first wavelength to illuminate said mask and said substrate through said projection optical system to accomplish an alignment between the pattern on said mask and said substrate;
    means for detecting aberrations of said projection optical system with respect to said first and second wavelengths; and
    correction means for accomplishing the correction in response to the difference in aberration between said first and second wavelengths in the case of attaining the alignment by said alignment means.

11. A projection optical apparatus as set forth in claim 10, wherein said aberration detecting means detects said aberrations at a plurality of positions within a projection field of said projection optical system.

12. A projection optical apparatus as set forth in claim 10, wherein said aberration detecting means comprises mark means for emitting the light from the surface thereof substantially in coplanar relationship with said image plane, photosensor means for receiving said light emitted from said mark means through said projection optical system and said mask and generating the output representative of the intensity of said received light and shift means for causing said mark means to shift along said image plane to generate an output representative of the shifted position of said mark means.

13. A projection optical apparatus as set forth in claim 12, wherein said photosensor means comprises a first photosensor for receiving said light at said first wavelength and a second photosensor for receiving said light at said second wavelength.

14. A projection optical apparatus as set forth in claim 12, wherein said mark means emitts the light including both of the light at said first wavelength and the light at said second wavelength.

15. A projection optical apparatus as set forth in claim 10, wherein said aberration detecting means detects distribution characteristics of aberrations of said first and second wavelengths.

* * * * *